United States Patent
Simin et al.

(10) Patent No.: US 8,994,035 B2
(45) Date of Patent: Mar. 31, 2015

(54) SEMICONDUCTOR DEVICE WITH LOW-CONDUCTING BURIED AND/OR SURFACE LAYERS

(71) Applicant: Sensor Electronic Technology, Inc., Columbia, SC (US)

(72) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 60 days.

(21) Appl. No.: 13/682,139

(22) Filed: Nov. 20, 2012

(65) Prior Publication Data

US 2013/0126905 A1    May 23, 2013

Related U.S. Application Data

(60) Provisional application No. 61/561,989, filed on Nov. 21, 2011.

(51) Int. Cl.
*H01L 29/78* (2006.01)
*H01L 29/16* (2006.01)
*G06F 17/50* (2006.01)
(Continued)

(52) U.S. Cl.
CPC ............ *H01L 29/78* (2013.01); *G06F 17/5068* (2013.01); *H01L 29/1608* (2013.01); *H01L 29/408* (2013.01); *H01L 29/423* (2013.01); *H01L 29/7786* (2013.01); *H01L 29/1075* (2013.01); *H01L 29/1079* (2013.01); *H01L 29/2003* (2013.01)
USPC ... 257/77; 257/192 J; 257/324; 257/E29.104; 257/E29.309

(58) Field of Classification Search
USPC ............. 257/77, 192, 324, E29.104, E29.309
See application file for complete search history.

(56) References Cited

U.S. PATENT DOCUMENTS

| 4,638,341 A | 1/1987 | Baier et al. |
| 5,126,284 A | 6/1992 | Curran |

(Continued)

FOREIGN PATENT DOCUMENTS

| JP | 2007048866 | 2/2007 |
| KR | 1020100138871 A | 12/2010 |

OTHER PUBLICATIONS

Le, Notice of Allowance for U.S. Appl. No. 13/396,059, Jul. 19, 2013, 8 pages.

(Continued)

*Primary Examiner* — Cathy N Lam
(74) *Attorney, Agent, or Firm* — LaBatt, LLC

(57) ABSTRACT

A device including one or more low-conducting layers is provided. A low-conducting layer can be located below the channel and one or more attributes of the low-conducting layer can be configured based on a minimum target operating frequency of the device and a charge-discharge time of a trapped charge targeted for removal by the low-conducting layer or a maximum interfering frequency targeted for suppression using the low-conducting layer. For example, a product of the lateral resistance and a capacitance between the low-conducting layer and the channel can be configured to be larger than an inverse of the minimum target operating frequency and the product can be smaller than at least one of: the charge-discharge time or an inverse of the maximum interfering frequency.

20 Claims, 7 Drawing Sheets

(51) Int. Cl.
*H01L 29/40* (2006.01)
*H01L 29/423* (2006.01)
*H01L 29/778* (2006.01)
*H01L 29/10* (2006.01)
*H01L 29/20* (2006.01)

(56) References Cited

U.S. PATENT DOCUMENTS

| | | | |
|---|---|---|---|
| 5,196,907 | A | 3/1993 | Burke et al. |
| 5,241,193 | A | 8/1993 | Pfiester et al. |
| 5,552,714 | A | 9/1996 | Adamian et al. |
| 6,107,649 | A | 8/2000 | Zhao |
| 6,207,584 | B1 | 3/2001 | Shen et al. |
| 6,285,042 | B1 | 9/2001 | Ohtani et al. |
| 6,538,538 | B2 | 3/2003 | Hreish et al. |
| 6,589,822 | B1 | 7/2003 | Yamazaki et al. |
| 6,690,042 | B2 | 2/2004 | Khan et al. |
| 6,690,176 | B2 | 2/2004 | Toncich |
| 6,759,839 | B2 | 7/2004 | Kodato |
| 6,812,714 | B2 | 11/2004 | Verspecht et al. |
| 6,878,593 | B2 | 4/2005 | Khan et al. |
| 6,903,385 | B2 | 6/2005 | Gaska et al. |
| 6,998,833 | B2 | 2/2006 | Wang et al. |
| 7,248,866 | B1 | 7/2007 | Tsironis |
| 7,282,911 | B2 | 10/2007 | Xiang et al. |
| 7,548,069 | B2 | 6/2009 | Simpson |
| 7,674,666 | B2 | 3/2010 | Simin et al. |
| 7,714,360 | B2 | 5/2010 | Otsuka et al. |
| 7,828,911 | B2 | 11/2010 | Gentschev et al. |
| 8,044,432 | B2 | 10/2011 | Chen et al. |
| 8,203,347 | B2 | 6/2012 | Nakayama et al. |
| 8,203,348 | B1 | 6/2012 | Tsironis |
| 8,461,631 | B2 | 6/2013 | Simin et al. |
| 8,586,997 | B2 | 11/2013 | Simin et al. |
| 2001/0009785 | A1 | 7/2001 | Arafa et al. |
| 2004/0036086 | A1 | 2/2004 | Khan et al. |
| 2004/0061129 | A1 | 4/2004 | Saxler et al. |
| 2005/0001234 | A1 | 1/2005 | Inoue et al. |
| 2005/0087752 | A1 | 4/2005 | Shur et al. |
| 2005/0173728 | A1 | 8/2005 | Saxler |
| 2005/0274977 | A1 | 12/2005 | Saito et al. |
| 2006/0019435 | A1 | 1/2006 | Sheppard et al. |
| 2006/0186422 | A1 | 8/2006 | Gaska et al. |
| 2006/0235638 | A1 | 10/2006 | Verspecht |
| 2006/0279275 | A1 | 12/2006 | Simpson |
| 2007/0278518 | A1 | 12/2007 | Chen et al. |
| 2007/0295993 | A1 | 12/2007 | Chen et al. |
| 2008/0121876 | A1 | 5/2008 | Otsuka et al. |
| 2008/0237606 | A1 | 10/2008 | Kikkawa et al. |
| 2008/0272397 | A1 | 11/2008 | Koudymov et al. |
| 2009/0008804 | A1 | 1/2009 | Standing et al. |
| 2009/0315078 | A1* | 12/2009 | Parikh et al. .......... 257/194 |
| 2010/0026315 | A1 | 2/2010 | Simpson |
| 2010/0156475 | A1 | 6/2010 | Simin et al. |
| 2011/0095336 | A1 | 4/2011 | Zundel et al. |
| 2011/0108885 | A1* | 5/2011 | Sazawa et al. .......... 257/192 |

OTHER PUBLICATIONS

Gordon, Notice of Allowance for U.S. Appl. No. 11/781,302, Feb. 14, 2013, 9 pages.
Kim, Tae Hoon, International Search Report and Written Opinion for International Application No. PCT/US2012/053896, Feb. 1, 2013, 9 pages.
Benitez, U.S. Appl. No. 12/646,121, Notice of Allowance, Nov. 19, 2012, 14 pages.
Le, Office Action for U.S. Appl. No. 13/396,059, Feb. 27, 2013, 25 pages.
Gondarenko, Office Action for U.S. Appl. No. 13/604,984, Jan. 2, 2014, 44 pages.
Gondarenko, Final Office Action for U.S. Appl. No. 13/604,984, Apr. 21, 2014, 19 pages.
Bradley Smith, "Office Action", U.S. Appl. No. 11/781,308, Notification Date: Apr. 6, 2009, 9 pages.
Matthew E. Gordon, "Office Action", U.S. Appl. No. 11/781,302, Notification Date: May 1, 2009, 12 pages.
Matthew E. Gordon, "Office Action", U.S. Appl. No. 11/781,302, Notification Date: Mar. 8, 2010, 13 pages.
Matthew E. Gordon, "Final Office Action", U.S. Appl. No. 11/781,302, Notification Date: Aug. 17, 2010, 13 pages.
Raj R. Gupta, "Office Action", U.S. Appl. No. 11/781,338, Notification Date: Mar. 6, 2009, 18 pages.
Raj R. Gupta, "Final Office Action", U.S. Appl. No. 11/781,338, Notification Date: Jul. 10, 2009, 15 pages.
Matthew E. Gordon, "Final Office Action", U.S. Appl. No. 11/781,302, Notification Date: Nov. 17, 2009, 23 pages.
Bradley Smith, "Notice of Allowance", U.S. Appl. No. 11/781,308, Date Mailed: Oct. 20, 2009, 13 pages.
Raj R. Gupta, "Notice of Allowance", U.S. Appl. No. 11/781,338, Date Mailed: Sep. 16, 2009, 10 pages.
Jon Kwon Kim, "PCT International Search Report and Written Opinion", PCT Application No. PCT/US2008/054368, Date of Completion: Jul. 30, 2008, 10 pages.
Sungjae Lee et al., "Record RF performance of 45-nm SOI CMOS Technology", IEDM Technical Digest, pp. 255-258, Copyright 2007.
R. Lai et al., "Sub 50 nm InP HEMT Device with Fmax Greater than 1 THz", IEDM Technical Digest, pp. 609-611, IEEE, Copyright 2007.
Zukauskas et al., "Solid State Lighting", Copyright Wiley 2002, http://nina.ecse.rpi.edu/shur/, 132 pages.
Koudymov et al., "RF Transmission Line Method for Wide-Bandgap Heterostructures", IEEE Electron Device Letters, vol. 30, No. 5, pp. 433-435, May 2009.
Simin et al., "III-Nitride Transistors with Capacitively Coupled Contacts", Applied Physics Letters 89, 033510, pp. 1-3, 2006.
Simin et al., "RF-Enhanced Contacts to Wide-Bandgap Devices", IEEE Electron Device Letters, vol. 28, No. 1, pp. 2-4, Jan. 2007.
Stillman et al., "Closing the Gap: Plasma Wave Electronic Terahertz Detectors", Journal of Nanoelectronics and Optoelectronics, vol. 2, No. 3, pp. 209-221, Dec. 2007.
Foutz et al., "Transient Electron Transport in Wurtzite GaN, InN, and AlN", Journal of Applied Physics, vol. 85, No. 11, pp. 7727-7734, Jun. 1, 1999.
G. Simin, "Wide Bandgap Devices with Non-Ohmic Contacts", ECS 2006—210th Meeting of the Electrochemical Society, Cancun, Mexico, Oct. 29-Nov. 3, 2006, 7 pages.
Pala et al., "Drain-to-Gate Field Engineering for Improved Frequency Response of GaN-based HEMTs", IEEE, 2007, 2 pages.
Turin et al., "Simulations of Field-Plated and Recessed Gate Gallium Nitride-Based Heterojunction Field-Effect Transistors", International Journal of High Speed Electronics and Systems, vol. 17, No. 1, pp. 19-23, 2007.
Mayo Clinic, "HRL InP NMIC GHz", http://www.mayo.edu/sppdg/packaging_development.html, 2 pages.
Simin et al., "High-Power III-Nitride Integrated Microwave Switch with Capacitively-Coupled Contacts", IEEE 2007, pp. 457-460.
Hess and Brennan (1984), Handbook of Semiconductor Parameters, "7.3.2. Transport Properties in High Electric Field", vol. 1, p. 156.
Arora, Ajay, USPTO Office Action, U.S. Appl. No. 12/645,876, Notification Date Jan. 3, 2012, 16 pages.
Gordon, U.S. Appl. No. 11/781,302, Office Action Communication, Jun. 27, 2012, 19 pages.
Arora, U.S. Appl. No. 12/645,876, Notice of Allowance & Fees Due, Aug. 21, 2012, 14 pages.
Kim, International application No. PCT/US2012/025146, International Search Report and the Written Opinion of the International Searching Authority, Aug. 1, 2012, 9 pages.
Benitez, U.S. Appl. No. 12/646,121, Office Action Communication, Sep. 7, 2012, 17 pages.
Gordon, U.S. Appl. No. 11/781,302, Office Action Communication, Oct. 12, 2012, 19 pages.
Sattu et al., "AlGaN/GaN Microwave Switch With Hybrid Slow and Fast Gate Design", IEEE Electron Device Letters, vol. 31, No. 12, Dec. 2010, 1389-1391.

(56) References Cited

OTHER PUBLICATIONS

Goud et al., "Analysis and Optimal Design of Semi-Insulator Passivated High-Voltage Field Plate Structures and Comparison with Dielectric Passivated Structures", IEEE Transactions on Electron Devices, vol. 41. No. 10, Oct. 1994, 1856-1865.

Clough et al., "Polycrystalline silicon thin film transistor incorporating a semi-insulating field plate for high voltage circuitry on glass", Appl. Phys. Lett. 71 (14), Oct. 6, 1997, 2002-2004.

Sul, International Search Report and Written Opinion for International Application No. PCT/US2012/066192, Feb. 20, 2013, 8 pages.

* cited by examiner

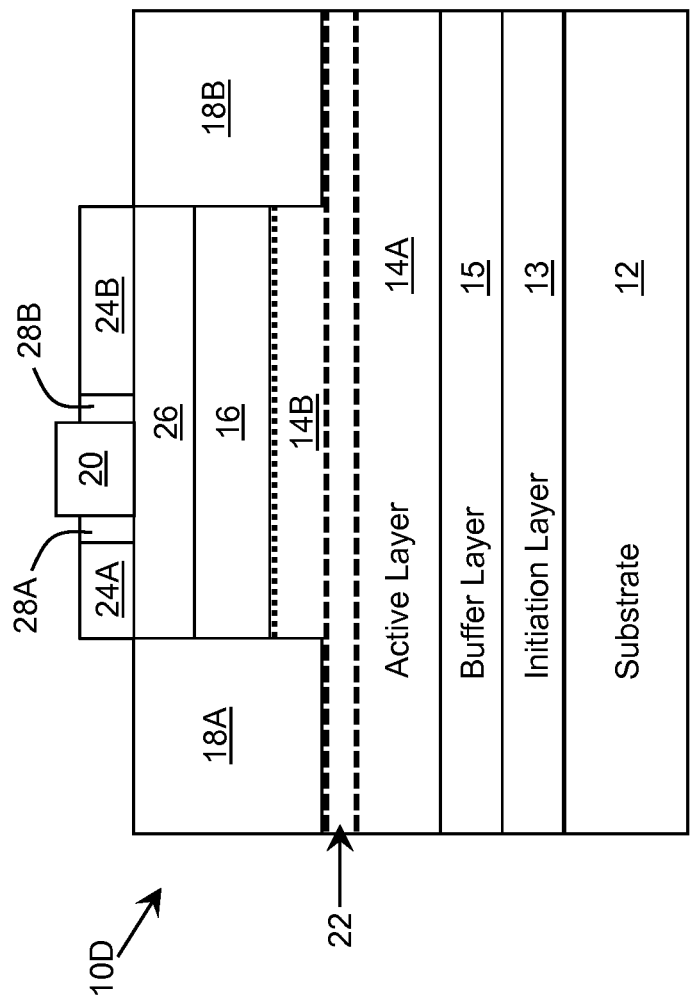

US 8,994,035 B2

SEMICONDUCTOR DEVICE WITH LOW-CONDUCTING BURIED AND/OR SURFACE LAYERS

REFERENCE TO RELATED APPLICATIONS

The current application claims the benefit of U.S. Provisional Application No. 61/561,989, titled "Semiconductor Device with Low-Conducting Buried and Surface Layers," which was filed on 21 Nov. 2011, and which is hereby incorporated by reference. Aspects of the current application also are related to U.S. patent application Ser. No. 13/396,059, titled "Semiconductor Device with Low-Conducting Field-controlling Element," which was filed on 14 Feb. 2012, and U.S. patent application Ser. No. 13/604,984, titled "Semiconductor Device with Low-Conducting Field-controlling Element," which was filed on 6 Sep. 2012, both of which are hereby incorporated by reference.

TECHNICAL FIELD

The disclosure relates generally to semiconductor devices, and more particularly, to a semiconductor device including one or more low-conducting layers.

BACKGROUND ART

The trapping of mobile carriers, i.e., electrons and holes, reduces the peak current, maximum operating frequency, microwave power, and efficiency of a semiconductor device. In many semiconductor devices, particularly in those made of wide bandgap materials such as gallium nitride (GaN), gallium phosphide (GaP), gallium arsenide (GaAs), indium phosphide (InP), and/or the like, mobile carrier trapping occurs due to the presence of various types of defects. Mobile carrier trapping can occur in the bulk of the material as well as at the device surface. Trapping occurring at the device surface is important in lateral devices, such as field effect transistors (FETs) having an active channel located close to the device surface.

Noise and interference are related issues that can affect the performance of a semiconductor device. Such noise and interference can be caused by a surface potential modulation occurring due to noise sources, industrial equipment, power lines, etc.

FIGS. 1A and 1B show illustrative heterostructure field effect transistors (HFETs) 2A and 2B, respectively, according to the prior art. In the HFET 2A, the active heterostructure is passivated using a passivation layer included over the gate G and covering an entire spacing between the source S and drain D. In the HFET 2B, a field plate electrically connected to the gate G is also included above the passivation layer. Various alternative configurations are possible. For example, an HFET can include several field plates connected to different electrodes. In each case, the surface element(s) are included to alleviate mobile carrier trapping and/or noise and interference.

SUMMARY OF THE INVENTION

Aspects of the invention provide a device including one or more low-conducting layers. A low-conducting layer can be located below the channel and one or more attributes of the low-conducting layer can be configured based on a minimum target operating frequency of the device and a charge-discharge time of a trapped charge targeted for removal by the low-conducting layer or a maximum interfering frequency targeted for suppression using the low-conducting layer. For example, a product of the lateral resistance and a capacitance between the low-conducting layer and the channel can be configured to be larger than an inverse of the minimum target operating frequency and the product can be smaller than at least one of: the charge-discharge time or an inverse of the maximum interfering frequency.

A first aspect of the invention provides a device comprising: a semiconductor structure including a channel; a set of contacts to the channel; and a set of buried low-conducting layers located below the channel in the semiconductor structure, wherein, for each buried low-conducting layer in the set of buried low-conducting layers, a product of a lateral resistance of the buried low-conducting layer and a capacitance between the buried low-conducting layer and the channel is larger than an inverse of a minimum target operating frequency of the device and the product is smaller than at least one of: a charge-discharge time of a trapped charge targeted for removal by the buried low-conducting layer or an inverse of a maximum interfering frequency targeted for suppression using the buried low-conducting layer.

A second aspect of the invention provides a field-effect transistor comprising: a source contact, a drain contact, and a device channel there between; a gate located on a surface side of the device channel; and a set of buried low-conducting layers located on a side opposite the surface side of the device channel, wherein, for each buried low-conducting layer in the set of buried low-conducting layers, a product of a lateral resistance of the buried low-conducting layer and a capacitance between the buried low-conducting layer and the channel is larger than an inverse of a minimum target operating frequency of the device and the product is smaller than at least one of: a charge-discharge time of a trapped charge targeted for removal by the buried low-conducting layer or an inverse of a maximum interfering frequency targeted for suppression using the buried low-conducting layer.

A third aspect of the invention provides a method comprising: designing a semiconductor device including a channel, a set of contacts to the channel, and a set of buried low-conducting layers located below the channel in the semiconductor structure, wherein the designing the semiconductor device includes: determining a minimum target operating frequency of the device; and for each buried low-conducting layer in the set of buried low-conducting layers, determining a target lateral resistance for the buried low-conducting layer such that a product of the target lateral resistance of the buried low-conducting layer and a capacitance between the buried low-conducting layer and the channel is larger than an inverse of a minimum target operating frequency of the device and the product is smaller than at least one of: a charge-discharge time of a trapped charge targeted for removal by the buried low-conducting layer or an inverse of a maximum interfering frequency targeted for suppression using the buried low-conducting layer; and designing each buried low-conducting layer in the set of buried low-conducting layers based on the corresponding target lateral resistance.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 3A-3D show illustrative semiconductor devices according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1B:
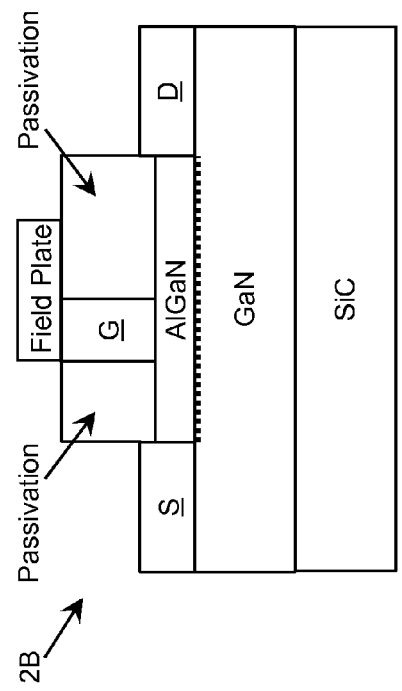
FIGS. 1A and 1B show illustrative heterostructure field effect transistors according to the prior art.
Figure 1A:
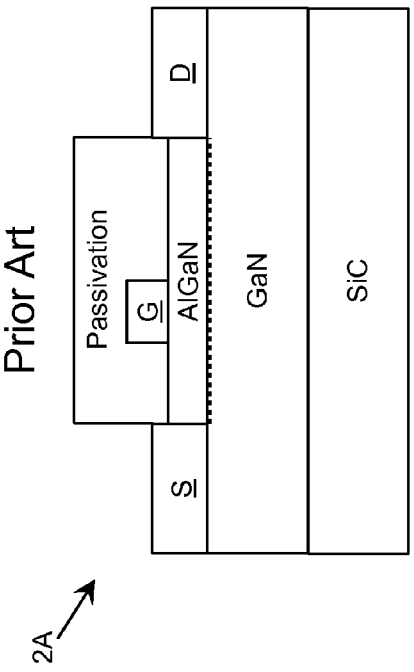
Figure 2:
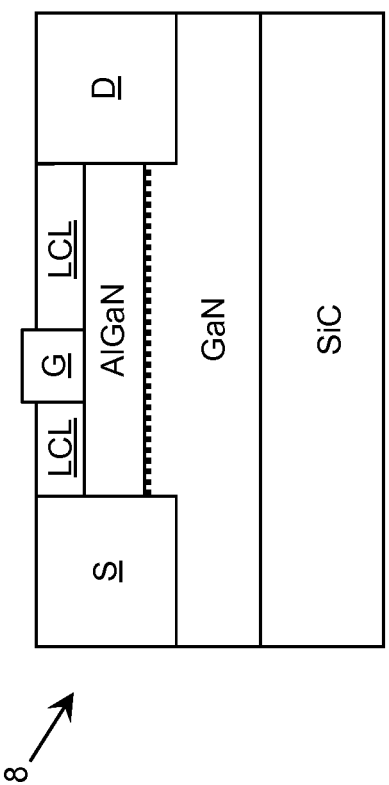
FIG. 2 shows an illustrative device according to a previously disclosed solution.
Figure 3A:
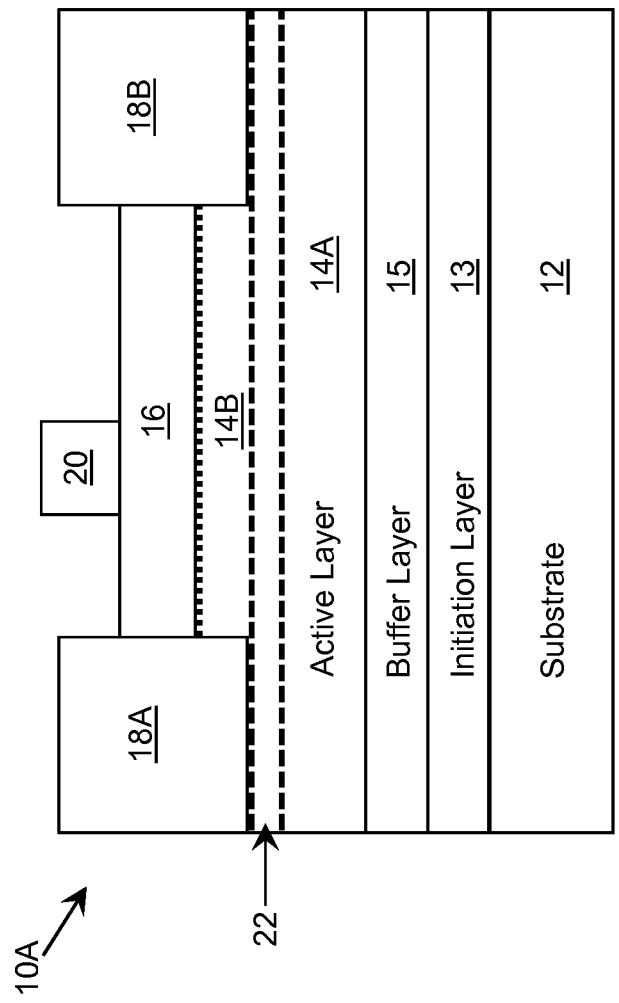
Figure 3B:
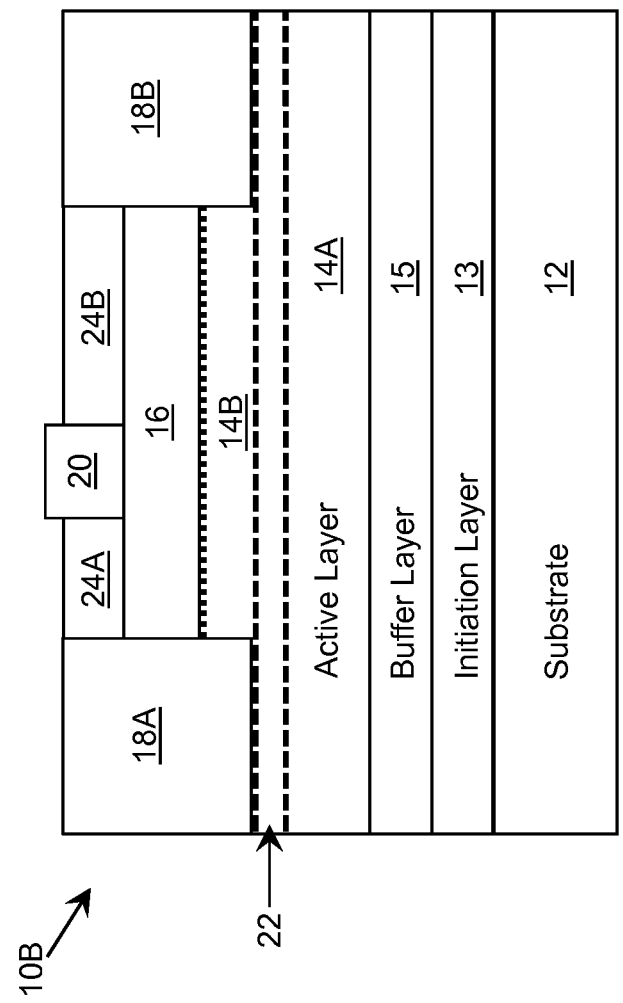
Figure 3C:
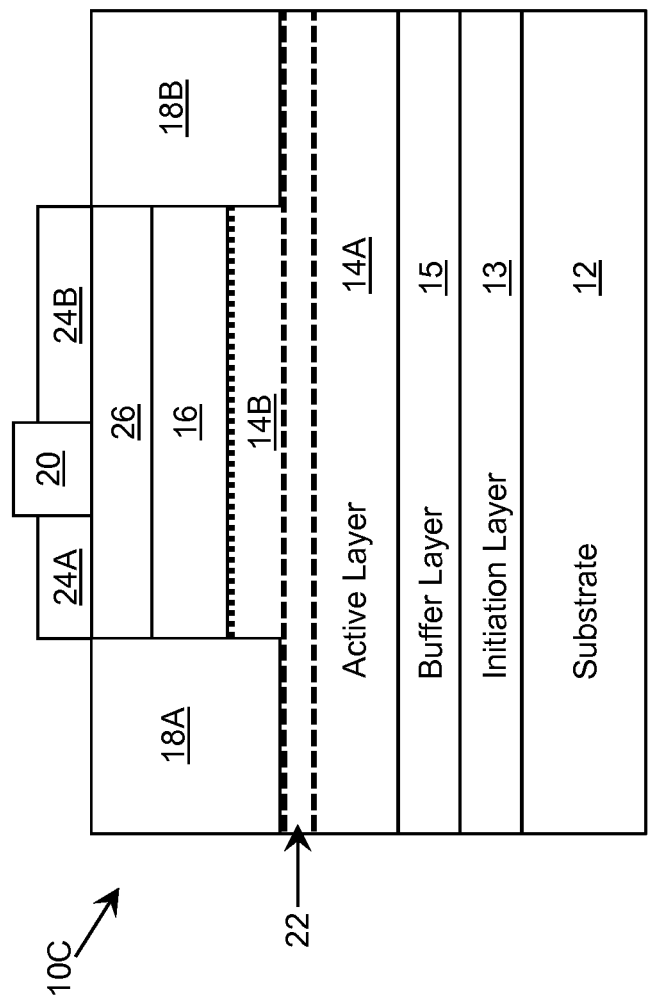

In previously disclosed solutions described in U.S. patent application Ser. No. 13/396,059 and U.S. patent application Ser. No. 13/604,984, the inventors describe the use of one or more surface layers of low-conducting field-controlling elements. For example, FIG. 2 shows an illustrative device 8 according to the previously disclosed solution. In the device 8, a set of low-conducting layers LCL is included, which includes one or more layers electrically connected to the gate G as well as the source S and/or the drain D. In the previously disclosed solution, the low-conducting field-controlling elements are configured based on a minimal operating frequency of the device and an inverse of a maximum control frequency of the device. During operation of the device 8, the set of low-conducting layers LCL can serve as a conduction path to remove trapped charges, and therefore reduce the gate G and/or drain D lags, which can be observed in group III nitride HFETs and other types of devices.

As indicated above, aspects of the invention provide a device including one or more low-conducting layers. A low-conducting layer can be located below the channel and one or more attributes of the low-conducting layer can be configured based on a minimum target operating frequency of the device and a charge-discharge time of a trapped charge targeted for removal by the low-conducting layer or a maximum interfering frequency targeted for suppression using the low-conducting layer. For example, a product of the lateral resistance and a capacitance between the low-conducting layer and the channel can be configured to be larger than an inverse of the minimum target operating frequency and the product can be smaller than at least one of: the charge-discharge time or an inverse of the maximum interfering frequency. As used herein, unless otherwise noted, the term "set" means one or more (i.e., at least one) and the phrase "any solution" means any now known or later developed solution.

Returning to the drawings, FIGS. 3A-3D show illustrative semiconductor devices 10A-10D, respectively, according to embodiments. Each device 10A-10D is shown including a substrate 12, an active layer 14A, 14B, a barrier layer 16, a source contact 18A, a drain contact 18B, and a gate 20, each of which can be manufactured and fabricated using any solution. The substrate 12 can be formed of any of various types of compound semiconductor or dielectric materials, including for example, sapphire, diamond, germanium (Ge), gallium nitride (GaN), silicon, silicon carbide (SiC), gallium arsenic (GaAs), and/or the like. Furthermore, the substrate 12 can comprise a conducting and/or semiconducting substrate.

As illustrated, an initiation layer 13 and a buffer layer 15 can be located between the substrate 12 and the active layer 14. However, it is understood that this is only illustrative of various possible configurations, each of which can include or not include the initiation layer 13 and/or the buffer layer 15. Similarly, a device 10A-10D can include one or more additional layers, which are not shown. Regardless, the heterostructure of a device 10A-10D can include various layers made from any of a plurality of materials systems. Furthermore, one or more of the layers in a heterostructure described herein can include one or more attributes to alleviate strain. For example, a layer can be formed of a superlattice structure.

In an embodiment, the substrate 12 is formed of SiC, the active layer 14 is formed of gallium nitride (GaN), and the barrier layer 16 is formed of aluminum gallium nitride (AlGaN). However, it is understood that this is only illustrative of various possible group III nitride based devices. To this extent, layers 13, 14, 15, 16 can be formed of any combination of various types of group III nitride materials comprising one or more group III elements (e.g., boron (B), aluminum (Al), gallium (Ga), and indium (In)) and nitrogen (N), such that $B_W Al_X Ga_Y In_Z N$, where $0 \le W, X, Y, Z \le 1$, and $W+X+Y+Z=1$. Illustrative group III nitride materials include AlN, GaN, InN, BN, AlGaN, AlInN, AlBN, InGaN, AlGaInN, AlGaBN, AlInBN, and AlGaInBN with any molar fraction of group III elements. Furthermore, it is understood that a device 10A-10D can be formed from other semiconductor materials, including other types of group III-V materials, such as such as GaAs, GaAlAs, InGaAs, indium phosphorus (InP), and/or the like.

Additionally, each device 10A-10D is shown including a buried low-conducting layer 22. The buried low-conducting layer 22 is located below the active region (e.g., a device channel formed at an interface of the active layer 14B and the barrier layer 16) within the device epitaxial structure in a vicinity of the device channel, e.g., within a channel space-charge region (generally within a distance of ten nanometers to one micrometer from the device active region). As illustrated, the buried low-conducting layer 22 can extend under all of the active region. However, it is understood that the buried low-conducting layer 22 also can only extend under a portion of the active region. Similarly, a device 10A-10D can include any combination of multiple buried low-conducting layers, each of which is located under a portion of the active region. The buried low-conducting layer 22 can be electrically connected and/or capacitively coupled to one or more of the device contacts.

A resistivity of the buried low-conducting layer 22 can be designed such that a characteristic time constant of the buried low-conducting layer 22 is lower than that of a trapped charge, but much higher than a period of a signal corresponding to a lowest target operating frequency for the device 10A-10D. In this manner, the buried low-conducting layer 22 can have a minimal effect on the operating frequency of the device, while being capable of removing the trapped charge. Such a configuration can be beneficial, for example, in group III nitride and other semiconductor materials in which a significant amount of carriers may be trapped in the buffer layer 15 of the device heterostructure.

Devices 10B-10D also are shown including a set of surface low-conducting layers (e.g., field-controlling elements) 24A, 24B. As illustrated, a device 10B-10D can include a surface low-conducting layer 24A located in the surface region between the source contact 18A and the gate 20 (gate-source region), and a surface low-conducting layer 24B located in the surface region between the gate 20 and the drain contact 18B (gate-drain region) of the device 10B-10D. However, it is understood that a device can include one or more surface low-conducting layers 24A, 24B located in any combination of one or more of: the gate-source region; the gate-drain region; the source-drain region; and/or the like. Furthermore, a device can include a low-conducting layer that forms an additional contact or passivation layer. To this extent, a low-conducting layer with low surface conductivity as described herein can be used in addition to or instead of regular metal electrodes.

An embodiment of a device can comprise an insulated gate configuration. To this extent, devices 10C, 10D also are shown including a gate insulating layer 26 located between the gate 20 and the barrier layer 16. As illustrated, the gate insulating layer 26 can extend across the entire region between the source contact 18A and the drain contact 18B. In this case, the low-conducting layers 24A, 24B also can be located on the gate insulating layer 26. Furthermore, the gate 20 also can be insulated from one or more of the low-conducting layers 24A, 24B. For example, the device 10D is shown including gate insulating walls 28A, 28B, each of which isolates the gate 20 from a corresponding low-conducting layer 24A, 24B, respectively. The insulating layers 26, 28A, 28B can be formed of any type of insulating material, such as silicon dioxide ($SiO_2$), silicon nitride ($Si_3N_4$), hafnium oxide ($HfO_2$), aluminum oxide ($Al_2O_3$), and/or the like.

It is understood that the various device configurations shown herein are only illustrative of numerous device configurations possible. To this extent, a device can include more or fewer layers having any of various configurations. For example, a device can include an isolation layer and/or a passivation layer over some or all of the surface of the structure. Additionally, it is understood that the low-conducting layers 22, 24A-24B described herein can be implemented in various types of field-effect transistors, including, for example, a field-effect transistor, a heterostructure field-effect transistor, an insulated gate field-effect transistor, an insulated gate heterostructure field-effect transistor, a multiple heterostructure field-effect transistor, a multiple heterostructure insulated gate field-effect transistor, an inverted field-effect transistor, an inverted heterostructure field-effect transistor, an inverted insulated gate field-effect transistor, an inverted insulated gate heterostructure field-effect transistor, an inverted multiple heterostructure field-effect transistor, an inverted insulated gate multiple heterostructure field-effect transistor, and/or the like. Additionally, the low-conducting layer(s) can be implemented in other types of semiconductor devices, including for example, a diode of any type, a semiconductor resistor, a semiconductor sensor, a light emitting diode, a laser, an integrated element, and/or the like.

In any event, each low-conducting layer 22, 24A-24B can be formed of a layer of any type of low-conducting material. The low-conducting material can have a surface resistance that is significantly higher than that of metal electrodes, but is also much lower than that of a dielectric material. Similarly, the low-conducting material can have a surface conductivity that is significantly lower than that of metal electrodes, but is also much higher than that of a dielectric material. As a result, the associated characteristic charging-recharging time of the low-conducting layer 22, 24A-24B is much higher than that of metal electrodes. To this extent, during operation of a device 10A-10D at DC or low frequencies (e.g., below 10 megahertz (MHz)), typically used for pulse or sinusoidal modulation, the low-conducting layers 22, 24A-24B will behave similar to metal electrodes. However, during operation of the device 10A-10D at high (signal) frequencies, (e.g., typically exceeding 100 MHz) the low-conducting layers 22, 24A-24B will behave similar to an insulator, thereby not deteriorating the device frequency performance. Illustrative low-conducting materials include, for example: InGaN; a semiconductor; a low-conducting dielectric single crystal; a textured, poly-crystalline or amorphous material; a semi-metal material; oxides of nickel and other metals; composite materials, such as aluminum oxide with embedded platinum; and/or the like.

As described herein, in an embodiment, it is desired for each low-conducting layer 22, 24A-24B to act as a conductor (e.g., electrode) when the corresponding device 10A-10D is operating at low frequencies. The low frequencies can correspond to, for example, an inverse of the characteristic carrier trapping/de-trapping times, a frequency at which interfering (e.g., noise, interference, and/or the like) signals occur, a highest frequency at which the interfering signals should be suppressed, and/or the like. However, within a target device operating frequency range, which includes much higher frequencies (e.g., at least ten times higher) than the low frequencies, each low-conducting layer 22, 24A-24B can act as a dielectric, thereby making only a minor increase in the total electrode area and, as a result, in the device capacitance.

In an embodiment, the design and configuration of each low-conducting layer 22, 24A-24B accounts for the characteristic charging-discharging time of the low-conducting layer 22, 24A-24B. For example, contrary to other approaches, the design and configuration of the low-conducting layer 22, 24A-24B identifies a range of acceptable lateral and/or sheet resistances/conductances and/or a target lateral and/or sheet resistance/conductance for a set of low-conducting layers 22, 24A-24B included in a device 10A-10D based on a target operating frequency (e.g., a minimal operating frequency), a characteristic charge-discharge time of a trapped charge targeted for removal, a frequency targeted for suppression (e.g., interfering frequency), and/or the like. In a more particular example, a low-conducting layer 22, 24A-24B is configured to have a sheet conductivity such that an associated characteristic charging-discharging time of the low-conducting layer 22, 24A-24B is much (e.g., at least ten times) higher than an inverse of the minimal target operating frequency and much (e.g., at least ten times) lower than a characteristic charge-discharge time of the trapped charge targeted for removal and/or an inverse of the maximum interfering frequency targeted for suppression. When a low-conducting layer 22, 24A-24B is configured in such a manner, the low-conducting layer 22, 24A-24B can normally behave as a conducting layer at direct current or low frequencies, but as an insulator within a target device operating frequency range, therefore not deteriorating the device frequency performance.

The following discussion provides a theoretical basis for determining an illustrative set of attributes of the device 10A-10D and the low-conducting layer 22, 24A-24B as currently understood by the inventors. As discussed herein, depending on a target function, the low-conducting layer 22, 24A, 24B can be located in the gate-source, gate-drain, or source-drain spacing, form an additional contact or passivation layer, be formed on a surface of the heterostructure or buried within the heterostructure, and/or the like. The following description uses a low-conducting layer located in the source-drain region of a group III-nitride based HFET as an illustrative example.

In order for the low-conducting layer to not significantly affect a radio frequency (RF) performance (e.g., impedance) of the device, a corresponding time constant for the low-conducting layer, $\tau_{LC}$, must be much larger than $1/(2\pi f)$, where f is the target operating frequency for the device. The time constant for the low-conducting layer can be expressed as $\tau_{LC} = R_{LC} C_{LC}$, where $R_{LC}$ is the lateral resistance of the low-conducting layer measured in a direction of the current flow in the device along the surface of the low-conducting layer and $C_{LC}$ is the total capacitance between the low-conducting layer and the device channel. This yields the following condition:

$$\tau_{LC} = R_{LC}C_{LC} \gg 1/(2\pi f) \quad (1)$$

Assuming $\tau_{LC}$ is at least approximately six times ($2\pi$ times) greater than $1/(2\pi f)$, the condition (1) can be rewritten as:

$$\tau_{LC} = R_{LC}C_{LC} > 1/f \quad (2)$$

As used herein, the lateral resistance of the low-conducting layer, $R_{LC}$, is related to the low-conducting layer sheet resistance, $R_{LCSH}$, as:

$$R_{LC} = R_{LCSH} * L/W \quad (2a)$$

where L and W are the length and width, respectively, of the low-conducting layer with respect to a direction of the current flow in the device.

Furthermore, the low-conducting layer should be sufficiently fast to allow for de-trapping of trapped carriers and/or screening interfering signals. Assuming a maximum de-trapping or interfering frequency, $f_C$, and following the derivation that led to condition (2) above, the required $\tau_{LC}$ also should meet the following condition:

$$\tau_{LC} < 1/f_C \quad (3)$$

As an example, for practical purposes and material selection, in order to meet both conditions (2) and (3), the value of the $\tau_{LC}$ can be selected as follows:

$$\tau_{LC} = 1/(f \times f_C)^{1/2} \quad (4)$$

As an illustrative example, assume a field effect transistor has the following attributes: a source to drain distance, L=5 µm; a gate-channel separation (also equal to the surface low-conducting layer-channel separation), d=20 nm; a channel width, W=1 mm; a relative dielectric permittivity of the material between the low-conducting layer and the channel, $\epsilon_r$=9; a target operating frequency, f=1 GHz; a characteristic carrier trapping time $\tau_{TR}$=0.16 µs; and a corresponding de-trapping frequency $f_C$=1 MHz. The low-conducting layer-channel capacitance can be calculated as, $C_{LC} = \epsilon_0 \epsilon_r L*W/d \approx 20$ pF, where $\epsilon_0$ is vacuum permittivity. From equation (2), the low-conducting layer resistance $R_{LC} = \tau_{LC}/C_{LC}$.

Using the above-described attributes and equations, values for $R_{LC}$ which provide the corresponding desired time constant for the low-conducting layer, $\tau_{LC}$, can be derived. For example, $\tau_{LC}$ can be configured to be greater than an inverse of the target operating frequency, e.g., greater than 1/1 GHz and less than an inverse of the de-trapping frequency, e.g., less than 1/1 MHz. Solving for $R_{LC}$, the $R_{LC}$ can be between $R_{LCMIN}$=1.6 kΩ/sq and $R_{LCMAX}$=1.6 MΩ/sq. As discussed herein, the $\tau_{LC}$ can be much larger than the inverse of the target operating frequency of the device and much smaller than the inverse of the de-trapping frequency. A target value of $R_{LC}$ between the $R_{LCMIN}$ and $R_{LCMAX}$ values can be selected based on the application of the corresponding device. In an embodiment, a target (e.g., optimal) value for $R_{LC}$, $R_{LC\_OPT}$, can be calculated using the formula: $R_{LC\_OPT} = \sqrt{R_{LCMIN} \cdot R_{LCMAX}}$. In this case, using the $R_{LCMIN}$ and $R_{LCMAX}$ calculated above, the target value for $R_{LC}$ in the device described herein is approximately 50.6 kΩ/sq.

Inclusion of one or more low-conducting layers described herein can provide one or more improvements to the operation of the device. For example, inclusion of a low-conducting layer 24B in the gate-drain spacing on the surface of the device 10B-10D can remove surface trapped charges within that spacing. Furthermore, inclusion of a set of low-conducting layers 24A, 24B over substantially an entire source-drain spacing on the surface of the device 10B-10D can remove the surface trapped charges as well as screen the active region from surface potential modulation caused by interfering sources. Additionally, inclusion of a buried low-conducting layer 22 can remove the bulk trapped charges in the corresponding region (e.g., across substantially an entire length of the channel) of the device 10A-10D. As a result, a device 10A-10D including one or more of the low-conducting layers 22, 24A-24B described herein can have an increased operating frequency, power, and/or efficiency over existing devices that do not include any low-conducting layers. Similarly, a device 10A-10D including one or more of the low-conducting layers 22, 24A-24B described herein can be more resistant to interfering signals, the impact of which can be reduced due to the presence of one or more of the low-conducting layers 22, 24A-24B described herein.

One or more aspects of a semiconductor device described herein can be designed using any solution. For example, the materials, dimensions, layer structure, and/or the like, can be selected and configured according to a target set of device operating properties using any solution. As part of designing the semiconductor device, one or more low-conducting layers can be designed as described herein. For example, a minimum target operating frequency for the semiconductor device can be determined. Subsequently, a target lateral resistance for the low-conducting layer can be determined such that a product of the target lateral resistance and a capacitance between the low-conducting layer and the device channel is larger than an inverse of the minimum target operating frequency of the device and the product is smaller than at least one of: a charge-discharge time of a trapped charge targeted for removal by the low-conducting layer or an inverse of a maximum interfering frequency targeted for suppression using the low-conducting layer. The low-conducting layer can then be designed based on the corresponding target lateral resistance, e.g., a material for the low-conducting layer can be selected to provide a lateral resistance approximately equal to the target lateral resistance.

It is understood that the various semiconductor devices described herein can be manufactured using any solution. For example, a device heterostructure can be formed using any solution, e.g., by obtaining (e.g., forming, preparing, acquiring, and/or the like) a substrate 12, forming (e.g., growing, depositing, adhering, and/or the like) an initiation layer 13 and/or a buffer layer 15 thereon, forming an active layer 14 thereon, and forming a barrier layer 16 on the active layer 14. Additionally, metal electrode(s), dielectric layer(s), and/or the like, can be formed on the device heterostructure using any solution. Furthermore, as described herein, the manufacture of the device can include the formation of one or more low-conducting layers using any solution. It is understood that the manufacture of a device described herein can include additional processing, including for example: the deposition and removal of a temporary layer, such as mask layer; the patterning one or more layers; the formation of one or more additional layers/contacts not shown; application to a submount (e.g., via contact pads); and/or the like.

While shown and described herein as a method of designing and/or fabricating a semiconductor device, it is understood that aspects of the invention further provide various alternative embodiments. For example, in one embodiment, the invention provides a method of designing and/or fabricating a circuit that includes one or more of the semiconductor devices designed and fabricated as described herein.

Figure 4:
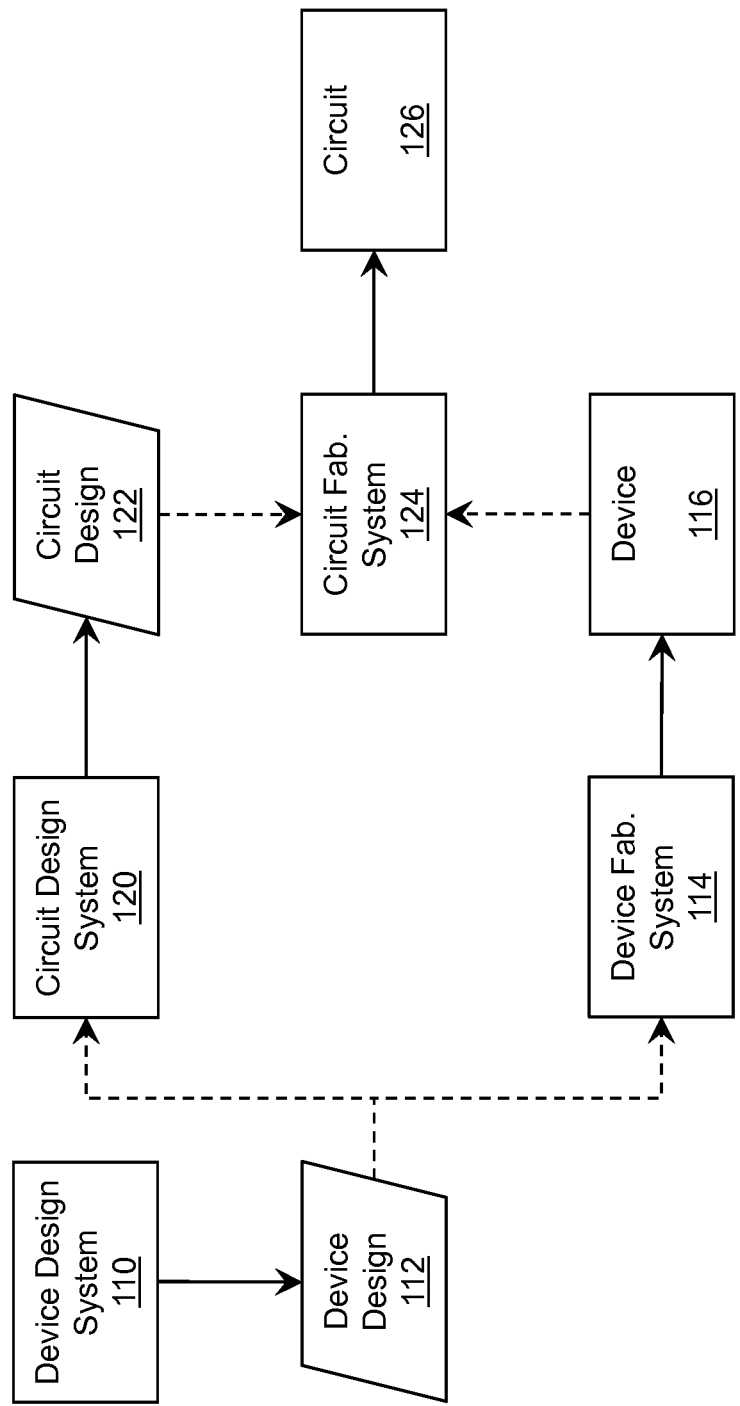
FIG. 4 shows an illustrative flow diagram for fabricating a circuit according to an embodiment.

To this extent, FIG. 4 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
    a semiconductor structure including a channel;
    a set of contacts to the channel; and
    a set of buried low-conducting layers located below the channel in the semiconductor structure, wherein, for each buried low-conducting layer in the set of buried low-conducting layers, a product of a lateral resistance of the buried low-conducting layer and a capacitance between the buried low-conducting layer and the channel is larger than an inverse of a minimum target operating frequency of the device and the product is smaller than at least one of: a charge-discharge time of a trapped charge targeted for removal by the buried low-conducting layer or an inverse of a maximum interfering frequency targeted for suppression using the buried low-conducting layer.

2. The device of claim 1, wherein each buried low-conducting layer in the set of buried low-conducting layers is formed of one of: a semiconductor material; a semimetal material; or a dielectric material.

3. The device of claim 1, further comprising a set of surface low-conducting layers located above the channel, wherein, for each surface low-conducting layer in the set of surface low-conducting layers, a product of a lateral resistance of the surface low-conducting layer and a capacitance between the surface low-conducting layer and the channel is larger than the inverse of the minimum target operating frequency of the device and the product of the lateral resistance of the surface low-conducting layer and the capacitance between the surface low-conducting layer and the channel is smaller than at least one of: a charge-discharge time of a trapped charge targeted for removal by the surface low-conducting layer or an inverse of a maximum interfering frequency targeted for suppression using the surface low-conducting layer.

4. The device of claim 3, wherein each of the set of buried low-conducting layers and the set of surface low-conducting layers covers substantially all of an area corresponding to the channel.

5. The device of claim 3, wherein at least one of the set of surface low-conducting layers is at least partially isolated from the semiconductor by an isolation layer having a sheet resistance at least an order of magnitude higher than a sheet resistance of the at least one of the set of surface low-conducting layers.

6. The device of claim 1, wherein at least one of the set of buried low-conducting layers forms at least one of: a passivation layer or a strain relieving layer.

7. The device of claim 1, wherein the semiconductor is formed of one of: silicon, silicon carbide, or a group III-V material.

8. The device of claim 1, wherein the semiconductor is formed of a group III nitride material.

9. The device of claim 1, wherein the device is configured to operate as a field-effect transistor.

10. A field-effect transistor comprising:
a source contact, a drain contact, and a device channel there between;
a gate located on a surface side of the device channel; and
a set of buried low-conducting layers located on a side opposite the surface side of the device channel, wherein, for each buried low-conducting layer in the set of buried low-conducting layers, a product of a lateral resistance of the buried low-conducting layer and a capacitance between the buried low-conducting layer and the channel is larger than an inverse of a minimum target operating frequency of the device and the product is smaller than at least one of: a charge-discharge time of a trapped charge targeted for removal by the buried low-conducting layer or an inverse of a maximum interfering frequency targeted for suppression using the buried low-conducting layer.

11. The transistor of claim 10, wherein each buried low-conducting layer in the set of buried low-conducting layers is formed of one of: a semiconductor material; a semimetal material; or a dielectric material.

12. The transistor of claim 10, further comprising a set of surface low-conducting layers located above the channel, wherein, for each surface low-conducting layer in the set of surface low-conducting layers, a product of a lateral resistance of the surface low-conducting layer and a capacitance between the surface low-conducting layer and the channel is larger than the inverse of the minimum target operating frequency of the device and the product of the lateral resistance of the surface low-conducting layer and the capacitance between the surface low-conducting layer and the channel is smaller than at least one of: a charge-discharge time of a trapped charge targeted for removal by the surface low-conducting layer or an inverse of a maximum interfering frequency targeted for suppression using the surface low-conducting layer.

13. The transistor of claim 12, wherein each of the set of buried low-conducting layers and the set of surface low-conducting layers covers substantially all of an area corresponding to the channel.

14. The transistor of claim 12, wherein at least one of the set of surface low-conducting layers is at least partially isolated from the semiconductor by an isolation layer having a sheet resistance at least an order of magnitude higher than a sheet resistance of the at least one of the set of surface low-conducting layers.

15. A method comprising:
designing a semiconductor device including a channel, a set of contacts to the channel, and a set of buried low-conducting layers located below the channel in the semiconductor structure, wherein the designing the semiconductor device includes:
determining a minimum target operating frequency of the device; and
for each buried low-conducting layer in the set of buried low-conducting layers, determining a target lateral resistance for the buried low-conducting layer such that a product of the target lateral resistance of the buried low-conducting layer and a capacitance between the buried low-conducting layer and the channel is larger than an inverse of a minimum target operating frequency of the device and the product is smaller than at least one of: a charge-discharge time of a trapped charge targeted for removal by the buried low-conducting layer or an inverse of a maximum interfering frequency targeted for suppression using the buried low-conducting layer; and
designing each buried low-conducting layer in the set of buried low-conducting layers based on the corresponding target lateral resistance.

16. The method of claim 15, wherein the designing each buried low-conducting layer includes selecting a material for the buried low-conducting layer based on the target lateral resistance.

17. The method of claim 15, wherein the semiconductor device further includes a set of surface low-conducting layers, and wherein the designing the semiconductor device further includes:
for each surface low-conducting layer in the set of surface low-conducting layers, determining a target lateral resistance for the surface low-conducting layer such that a product of a lateral resistance of the surface low-conducting layer and a capacitance between the surface low-conducting layer and the channel is larger than the inverse of the minimum target operating frequency of the device and the product of the lateral resistance of the surface low-conducting layer and the capacitance between the surface low-conducting layer and the channel is smaller than at least one of: a charge-discharge time of a trapped charge targeted for removal by the surface low-conducting layer or an inverse of a maximum interfering frequency targeted for suppression using the surface low-conducting layer; and
designing each surface low-conducting layer in the set of surface low-conducting layers based on the corresponding target lateral resistance.

18. The method of claim 17, wherein each of the set of buried low-conducting layers and the set of surface low-conducting layers covers substantially all of an area corresponding to the channel.

19. The method of claim 17, wherein at least one of the set of surface low-conducting layers is at least partially isolated from the semiconductor by an isolation layer having a sheet resistance at least an order of magnitude higher than a sheet resistance of the at least one of the set of surface low-conducting layers.

20. The method of claim 15, wherein the device is configured to operate as a field-effect transistor.

* * * * *